(12) United States Patent
Li

(10) Patent No.: US 7,863,953 B2
(45) Date of Patent: Jan. 4, 2011

(54) APPARATUS AND METHOD FOR USE WITH QUADRATURE SIGNALS

(75) Inventor: Kim Li, Sheffield (GB)

(73) Assignee: Jennic Limited (GB)

( * ) Notice: Subject to any disclaimer, the term of this patent is extended or adjusted under 35 U.S.C. 154(b) by 0 days.

(21) Appl. No.: 12/343,132

(22) Filed: Dec. 23, 2008

(65) Prior Publication Data

US 2010/0156465 A1    Jun. 24, 2010

(51) Int. Cl.
*H03L 7/06* (2006.01)

(52) U.S. Cl. .................. 327/156; 327/157; 327/120; 327/231; 327/255; 327/276

(58) Field of Classification Search .................. 327/115, 327/156, 244–245, 254–259
See application file for complete search history.

(56) References Cited

U.S. PATENT DOCUMENTS

| | | | |
|---|---|---|---|
| 2001/0054919 A1* | 12/2001 | Wang | 327/119 |
| 2004/0036541 A1* | 2/2004 | Fang et al. | 331/74 |
| 2006/0091919 A1* | 5/2006 | Darabi | 327/115 |
| 2009/0009226 A1* | 1/2009 | Mellor et al. | 327/255 |
| 2009/0045861 A1* | 2/2009 | Hayden et al. | 327/238 |
| 2009/0068975 A1* | 3/2009 | Luong et al. | 455/325 |

* cited by examiner

*Primary Examiner*—Vibol Tan
(74) *Attorney, Agent, or Firm*—Wilmer Cutler Pickering Hale & Dorr LLP.

(57) ABSTRACT

Embodiments of the present invention provide a current mode logic circuit, comprising first and second differential switching stages, each stage arranged being arranged to receive a plurality of clock signals, such that the first and second differential switching stages respond to a combination of the plurality of clock signals.

16 Claims, 6 Drawing Sheets

APPARATUS AND METHOD FOR USE WITH QUADRATURE SIGNALS

BACKGROUND

In many digital signals processing applications, such as digital communication systems, quadrature signals are utilized. Quadrature signals are formed by two components, referred to as I and Q signals, having the same frequency and amplitude, but which are 90° degrees out of phase, as shown in FIG. 1.

Frequently in digital communication systems a circuit or circuit element is connected to only one of the I and Q signals. In this case, the I and Q signals are loaded asymmetrically. For example, in a down-converter a phase locked loop (PLL) is connected to only the I signal. However, it is important to ensure that the quadrature relationship is maintained between the I and Q signals, that is, that they remain 90° degrees out of phase.

One solution to ensuring that the I and Q signals remain 90° degrees out of phase disclosed in US 2006/0091919 is to connect a dummy load to the one of the I and Q signals which is not connected to the circuit element. FIG. 2 shows a system including a divide by two circuit 110 which is arranged to output I and Q signals. The I signal is received by a further divide by two circuit 120, whilst the Q signal, in order to remain 90° out of phase with the I signal, is connected to a dummy load 130. However, the use of such a dummy load may affect a relative amplitude of the Q signal compared to the I signal, waste power and/or generate additional heat.

It is an object of embodiments of the invention to at least mitigate one or more of the problems of the, prior art.

BRIEF DESCRIPTION OF THE DRAWINGS

Embodiments of the invention will now be described by way of example only, with reference to the accompanying figures, in which.

DETAILED DESCRIPTION OF EMBODIMENTS OF THE INVENTION

Figure 3:
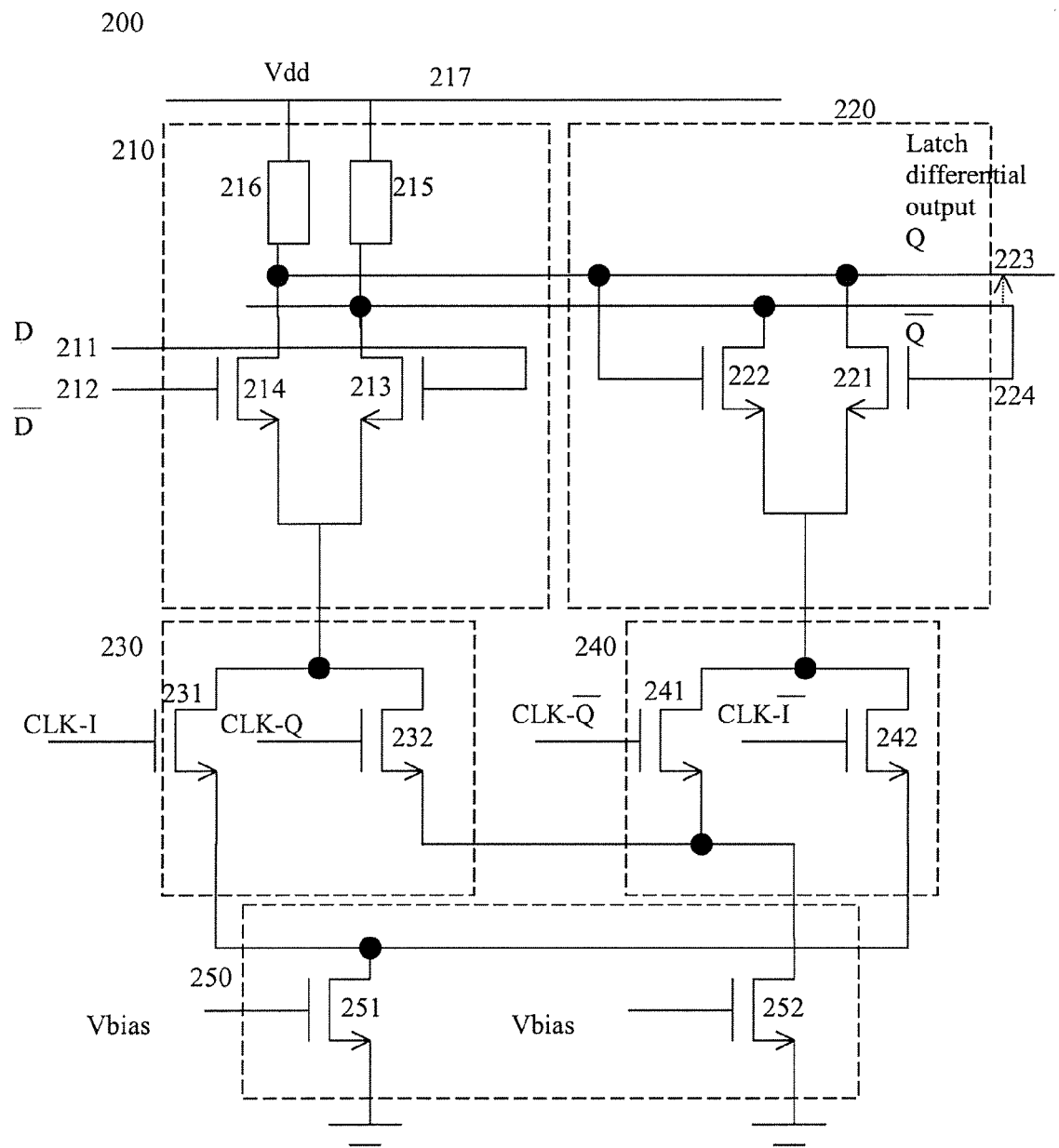
FIG. 3 shows a schematic circuit diagram of a current mode logic latch circuit according to an embodiment of the present invention.

Referring to FIG. 3, a D-type latch circuit 200 according to an embodiment of the present invention is shown. The latch circuit 200 is a current mode logic (CML) circuit in which input clock signals are applied to a pair of differential switching stages and a differential output voltage is taken from between the switching stages.

The latch 200 comprises an input-tracking stage 210, operative in an input tracking mode to track an input data value, a data storage stage 220 operative in a data storage mode to store the data value output by the input-tracking stage 210, first and second differential switching stages 230, 240 operative to select between operation of the input tracking stage 210 and the data storage stage 220, and a bias stage 250 which biases the switching stages 230, 240 to control input voltage levels required to activate the switching stages 230, 240.

The input tracking stage 210 comprises a D input 211 to receive an input data signal. The D input 211 is connected to a gate input of a first FET 213. The input tracking stage 210 further receives a ¬D (not D or D inverse) input 212 which is connected to a gate input of a second FET 214. The first and second FETs 211, 212 form a differential pair of FETs. A drain connection of each of the FETs 213, 214 is connected to a resistor 215, 216 which is, in turn connected to a voltage supply line 217 which may carry a supply voltage $V_{dd}$. Source connections of each FET 213, 214 are connected together to a first input of the first switching stage 230.

The data storage stage 220 comprises a pair of cross-coupled regenerative FETs 221, 222. A drain of a first FET 221 of the data storage stage 220 is connected to a first 216 of the resistors together with the drain of the second FET 214 of the input-tracking stage 210. A gate input of a second FET 222 of the data storage stage 220 is also connected to the first resistor 216 and drain of the first FET 214. Similarly, a drain of the second FET 222 of the data storage stage 220 is connected to a second 215 of the resistors in parallel with a gate of the first FET 221 of the data storage stage 220. Source connections of each FET 221, 222 of the data storage stage are connected together to an input of the second switching stage 240.

A Q output 223 of the apparatus is taken from the gate input to the second FET 222 of the data storage stage 220. Likewise, a ¬Q output 224 from the apparatus may be output from the gate input to the first FET 221 of the data storage stage 220.

The input-tracking stage 210 and the data storage stage 220 are operatively selected by the first and second switching stages 230, 240. Each of the switching stages 230, 240 comprises two pairs of FETS 231, 232; and 241, 242 arranged in parallel between source connections of FETs of the input tracking 210 and data storage 220 stages, respectively, and ground via drain connections of two bias FETs 251, 252 which form the bias stage 250. Whilst the circuit shown in FIG. 3 shows there being two separate current paths through the bias FETs 251, 252, it will be realized that source connections of the FETs 231, 232, 241, 242 forming the first and second switching stages may be connected together.

A gate connection of the first FET 231 of the first switching stage 230 is arranged to receive an I signal and a gate of the second FET 232 is arranged to receive a Q signal, wherein the I and Q signals are 90° out-of-phase. Drain connections of both the first and second FETs 231, 232 are connected to the source connections of the FETs 213, 214 forming the input-tracking stage 210. A source connection of the first FET 231 is connected to a drain of the first bias FET 251 of the bias stage 250 and a source connection of the second FET 232 is connected to a drain of the second bias FET 252.

Similarly, a drain connection of the first FET 241 of the second switching stage 240 is connected to the source connections of the FETs 221, 222 of the data storage stage 220, and a drain of the second FET 242 of the second switching stage 240 is connected to the source connections of the FETs 221, 222 of the data storage stage 220. A gate of the first FET 241 is arranged to receive a ¬Q input and a gate of the second FET 242 is arranged to receive a ¬I input. A source connection of the first FET 241 is connected to a drain of the second bias FET 252, whilst a source connection of the second FET 242 is connected to a drain of the first bias FET 251.

It will be noted that the first and second switching stages 230, 240 are arranged to receive input signals having opposing values and, therefore, to activate either one of the input-tracking stage 210 or the data storage stage 220 according to the I and Q signals.

In order to activate the input-tracking mode, in which the output of the input tracking stage 210 tracks the D input 211, current must flow through both of the first pair of FETs 231, 232 forming the first switching stage 230. A bias voltage $V_{bias}$ applied to gate terminals of the bias FETs 251, 252 is determined such that a source-drain current is required to flow through both of first and second FETs 231, 232 of the first switching stage 230 in order to activate the input-tracking stage 210. In a conventional latch receiving a single clock input, a bias current of I is required to activate either an input-tracking stage or a data storage stage of a latch. However, in embodiments of the present invention, a bias current of less than or generally equal to $I/\sqrt{2}$ is required pass through each of the first and second 231, 232 of the first switching stage 230 or the first and second FETs 241, 242 of the second switching stage 240 to activate either the input-tracking stage 210 or the data storage stage 220. Thus, embodiments of the present invention use 29.3% less power than a conventional latch.

In use, the first and second FETs 231, 232 of the first switching stage 230 receive, on their respective gate inputs, I and Q signals. However, the bias voltage $V_{bias}$ applied to the FETs 251, 252 of the bias stage 250 is set at a level which prevents either the first or second FETs 231, 232 alone activating the input-tracking stage 210. That is, the peak source-drain current of either the FET 231, 232 alone is not enough to activate the input tracking stage 210 due to the bias voltage $V_{bias}$. Thus, the input tracking stage 210 is not activated by solely either the I or Q input. The input-tracking stage 210 is only activated when the combined current through both of the FETs 231, 232 of the first switching stage 230 reaches a predetermined level. This effectively activates the input-tracking stage 210 in response to a combined I and Q signal (the result of phasor addition of the I and Q signals) having a magnitude of $V\sqrt{2}$ where V is a peak voltage of the I and Q signals and a phase 45° in-between the I and Q signals. Thus, the Q output of the input-tracking stage 210 adopts the value of the D input 211 in response to a combination of the I and Q signals. At this time, the ¬I and ¬Q inputs to the second switching stage 240 are relatively low and therefore a substantial gate current does not flow through the first and second FETs 241, 242 forming the second switching stage 240. However, in a duration of a half-cycle time of the input I and Q signals, the data storage stage 220 is activated by a combination of ¬I and ¬Q signals having a phase of 45° in between the I and Q signals whilst the data input stage 210 is not activated at that time.

Figure 4:
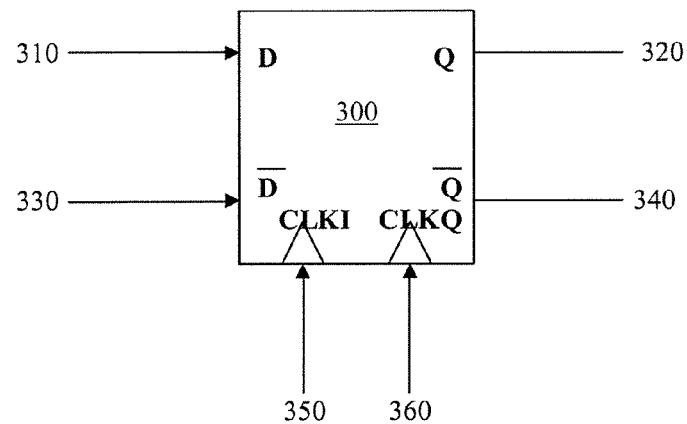
FIG. 4 shows a circuit symbol representing a latch according to an embodiment of the invention.

FIG. 4 shows a schematic circuit symbol 300 representing the latch circuit shown in FIG. 3. The latch 300 comprises a Data input 310 and a Q output 320 (it will be noted that Q is used to represent the latch output as is conventional and that the signal present on this line is not to be confused with the Q clock signal). The latch 300 may also comprise a ¬Data input 330 (the inverse of the Data input 310) and a ¬Q output 340 (the inverse of the Q output 320). The latch in FIG. 4 further comprises differential clock inputs 350 and 360. The I clock signal is provided to a CLKI input 350 and the Q lock signal is provided a CLKQ input 360.

Figure 5:
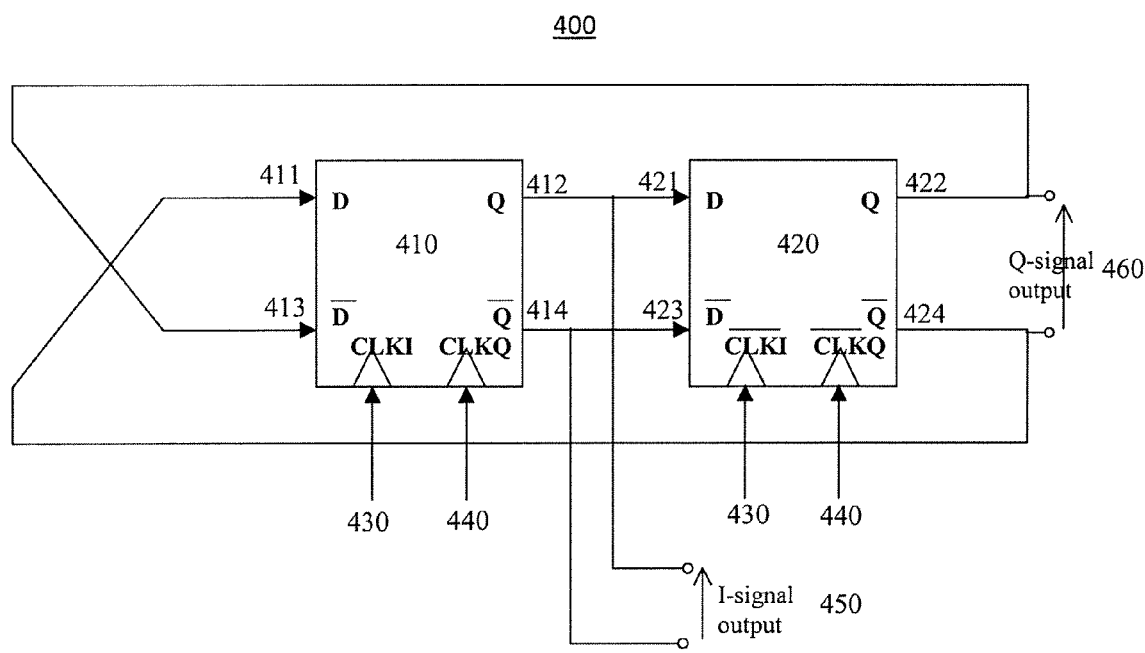
FIG. 5 shows a divide by two circuit formed using latches according to an embodiment of the present invention.

FIG. 5 shows a divide-by-two circuit 400 according to an embodiment of the invention. The circuit 400 is formed by two latches 410, 420 as shown in FIG. 3, each of which is arranged to receive I and Q clock signals 430, 440. A D input of a first latch 410 is provided with an input signal by a ¬Q output 424 of a second latch 420. Similarity, a ¬D input 413 of the first latch 410 is provided with an input from a Q output 422 of the second latch 420. D and ¬D inputs 421, 423 of the second latch 420 are provided with input signals from Q and ¬Q outputs 414, 414 of the first latch 410. Divided-by-two I and Q clock signals are output from between the Q and ¬Q outputs 412, 414 of the first latch 410 and Q and ¬Q outputs 422, 424 of the second latch 420.

Figure 6:
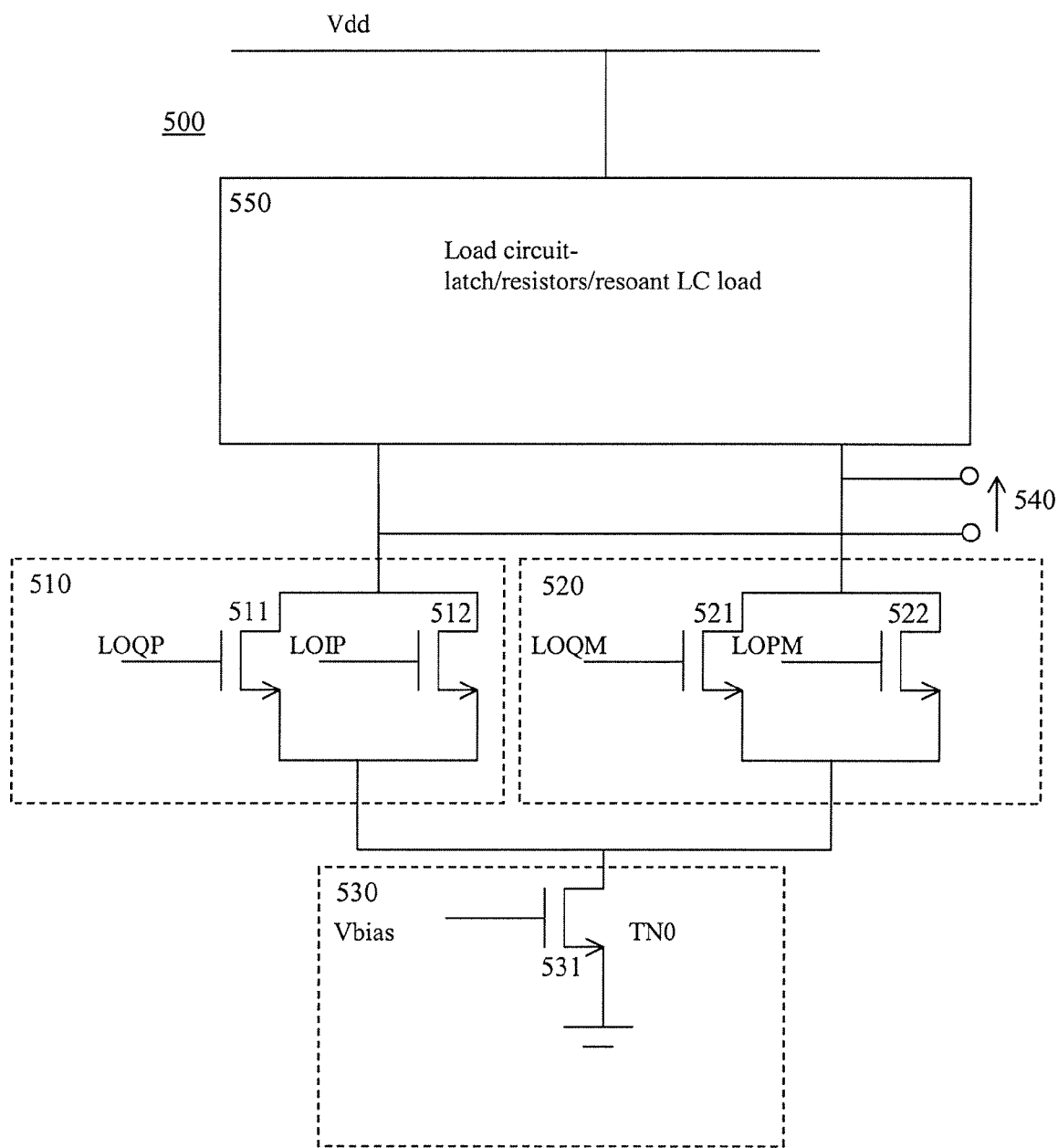
FIG. 6 shows a current mode logic buffer circuit according to an embodiment of the present invention.

A current mode inverting buffer circuit according to an embodiment of the present invention will now be described with reference to FIG. 6.

A buffer circuit 500 comprises first 510 and second 520 switching stages, a bias stage 530, an output 540 and a load 550. The first switching stage 510 comprises first and second FETs 511, 512 arranged in parallel. The first FET 511 is arranged to operatively receive an I signal whilst the second FET receives a Q signal. The second switching stage 520 comprises first and second FETs 521, 522 arranged in parallel to receive ¬I and ¬Q (inverse of I and Q respectively) signals. The first and second switching stages 510, 520 are arranged between the load 550 and the bias stage 530. The load 550 provides a load between $V_{dd}$ and ground when either of the first and second switching stage 510, 520 is operated to form a low resistance. In some embodiments, the load 550 may comprise first and second resistors each arranged between one of the first and second switching stages 510, 520. However, the load 550 may be formed by one or a combination of a latch or resonant impendence/capacitance circuit components. The bias stage 530 comprises a FET 531 biased by a gate voltage such that a summation of both I and Q or ¬I and ¬Q signals is required to create a significant voltage difference at the output 540.

In operation, the first switching stage 510, 520 is operated in response to an effective phasor summation of the I and Q signals to allow a channel current to flow through both FETs 511, 512 such that a voltage at the respective output terminal falls. The first switching stage 510 is therefore effectively operated in response to a signal formed by phasor summation of the I and Q signals having a phase of 45° in between that of the I and Q signals. Similarly, the second switching stage is operated in response to an effective summation of the ¬I and ¬Q signals. Since the first and second switching stages are operated by complimentary signals, their response and consequent output voltages at the output terminals 540 are complimentary. When the effective input signal (phasor summation of I and Q signal) provided to the first switching stage 510 is high, the output voltage at the output terminal controlled by the first switching stage 510 falls in response to a decreased channel resistance of FETs 511, 512. At the same time, the effective input signal provided to the second switching unit 520 is low and a voltage at the respective output terminal controlled by the second switching stage 520 is high. Thus, a potential difference exists between the output terminals 540. The voltage at the output terminals 540 is an inverse of the effective signal produced by summation of the I and Q signals. Thus, the circuit 500 as shown provides an inverter operation. However, a buffer operation may be achieved by providing I and Q signals to the second switching unit 520 and the ¬I and ¬Q signals to the first switching unit 510.

Figure 7:
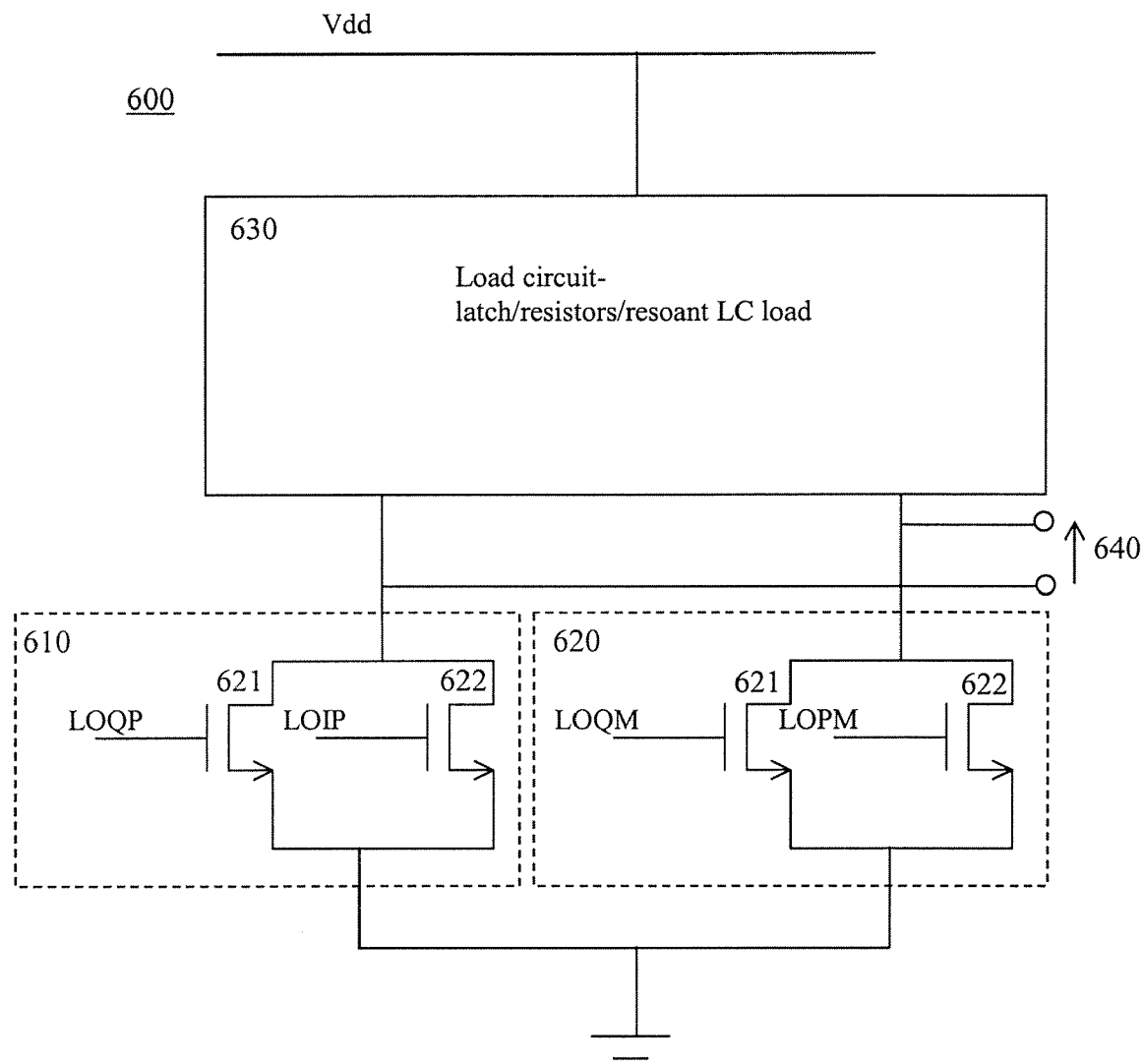
FIG. 7 shows a current mode logic buffer circuit according to another embodiment of the present invention.

A further embodiment of buffer circuit 600 is shown in FIG. 7 which is useful in applications in which $V_{dd}$ is relatively low. Unless otherwise described, the circuit 600 has identical operation to that described with reference to FIG. 6.

The circuit 600 comprises first and second switching stages 610, 620, a load 630 and an output 640 as in the previously described embodiment. However, in contrast to the previously described embodiment, the circuit 600 does not include a bias stage to allow for $V_{dd}$ being relatively low.

Figure 1:
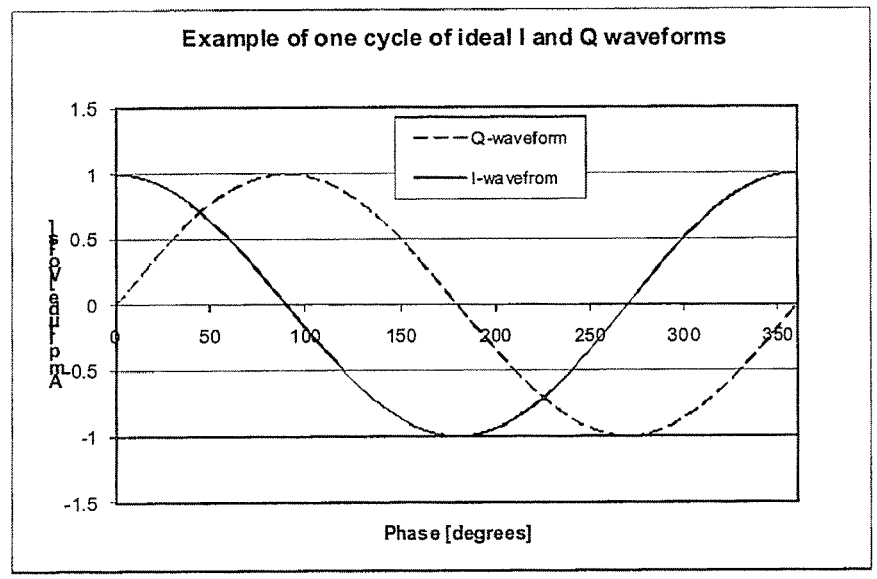
FIG. 1 shows an example of I and Q quadrature signals.
Figure 2:
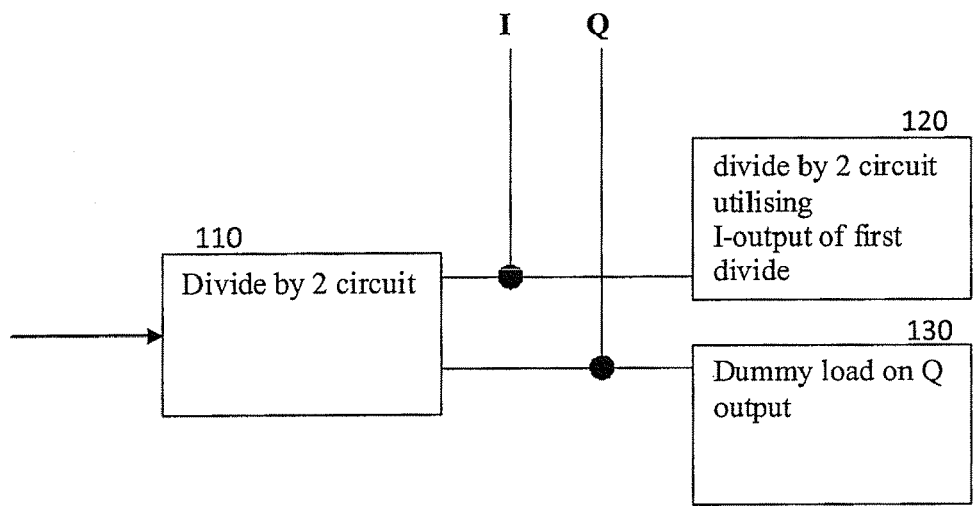
FIG. 2 shows a schematic illustration of a circuit incorporating a dummy load for a Q signal.
Figure 8:
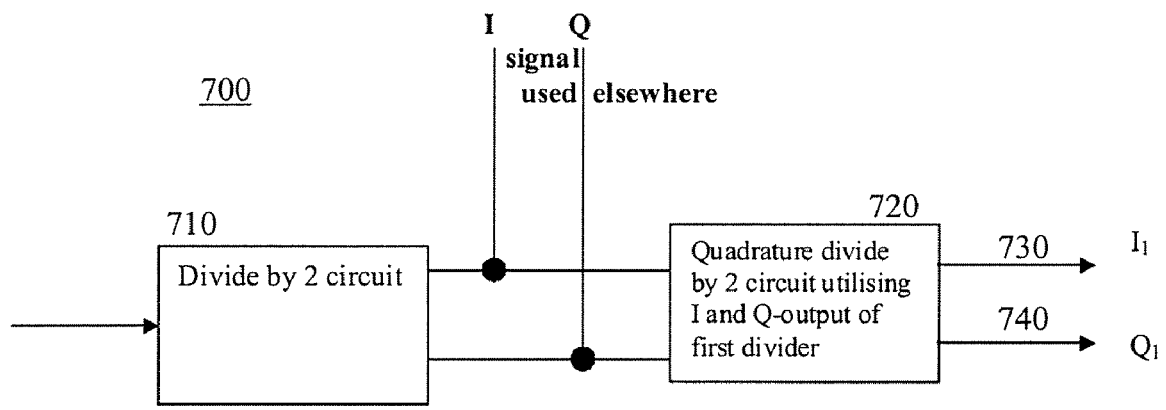
FIG. 8 shows a divide by two circuit according to an embodiment of the present invention.

FIG. 8 shows a circuit 700 including a divide by two circuit according to an embodiment of the present invention. The circuit 700 comprises a first divide by two circuit 710 used to generate quadrature I and Q signals, as in FIG. 2. The circuit further includes a divide by two circuit 720 according to an embodiment of the invention as shown in FIG. 5. The divide by two circuit equally loads the I and Q signals. An output of the divide by two circuit 720 is I and Q signals 730, 740 having the same phase and amplitude, although these may be different from the input I and Q signals this is not generally as important as the relationship between the I and Q signals themselves. The originally input I and Q signals may be used elsewhere.

Advantageously, embodiments of the present invention equally load both I and Q quadrature signals. This results in the I and Q signals retaining an equal amplitude and phase. In addition, due to the phasor addition of the I and Q signals resulting in an effective combined signal having a greater amplitude, less power is consumed by the circuit. Furthermore, a dummy load is not required. Embodiments of the present invention may be utilized to reduce current consumption or to operate with I and Q signals of a reduced signal voltage of $V/\sqrt{2}$. In this case, embodiments of the invention require a bias current of I as in a conventional circuit but advantageously operate with reduce I and Q signal voltages.

It will be appreciated that embodiments of the present invention can be realized in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A current mode logic circuit, comprising first and second differential switching stages, wherein each of the first and second differential switching stages comprises a plurality of switching devices in a parallel arrangement each arranged to receive one of a plurality of clock signals, each of the first and second differential switching stages responds to a combination of the plurality of clock signals applied to the switching devices, wherein the plurality of switching devices of the first differential switching stage includes first and second switching devices each having a control terminal, a first terminal and a second terminal, the plurality of switching devices of the second differential switching stage includes first and second switching devices each having a control terminal, a first terminal and a second terminal, and wherein the second terminal of first switching device of the first differential switching stage is connected to the second terminal of the first switching device of the second differential switching stage and the second terminal of the second switching device of the first differential switching stage is connected to the second terminal of the second switching device of the second differential switching stage.

2. The logic circuit of claim 1, wherein the first and second switching devices of the first switching stage are for receiving first and second clock signals, respectively, wherein the first and second clock signals are spaced apart by a predetermined duration, and the first switching device of the second switching stage is for receiving a third clock signal spaced apart from the first clock signal by substantially 180° and the second switching device of the second switching stage is arranged to receive a fourth clock signal spaced apart from the second signal by substantially 180°.

3. The logic circuit of claim 1, comprising first and second loads connected between a voltage supply line and the first and second switching stages respectively, wherein a voltage difference across each load is relatively low when the respective switching stage responds to the combination of the clock signals.

4. The logic circuit of claim 3 arranged to perform a latch function, wherein the load of the first switching stage is an input data tracking stage and the load of the second switching stage is a data storage stage.

5. The logic circuit of claim 1, comprising a bias stage for controlling an input voltage required for the first and second switching stages to respond to the combination of the plurality of clock signals.

6. The logic circuit of claim 1, wherein the first and second switching stages respond to an effective clock signal produced as a result of phasor addition of the plurality of clock signals.

7. The current mode logic circuit of claim 1, wherein the first and second switching stages are arranged to load the plurality of clock signals substantially equally.

8. A current mode latch circuit comprising:
an input tracking stage having at least one input for receiving an input data signal and at least one output for outputting a data signal which operatively tracks a data value of the input signal;
a data storage stage for operatively storing a data value output by the input tracking stage; and
first and second differential switching stages wherein each of the first and second differential switching stages comprises a plurality of switching devices in a parallel arrangement each arranged to receive one of a plurality of clock signals, and each differential switching stage responds to a combination of the clock signals applied to the switching devices, wherein the first and second differential switching stages are arranged to selectively activate either the input tracking or the data storage stage in response to a combination of the plurality of clock signals, wherein the plurality of switching devices of the first differential switching stage includes first and second switching devices each having a control terminal, a first terminal and a second terminal, the plurality of switching devices of the second differential switching stage includes first and second switching devices each having a control terminal, a first terminal and a second terminal, and wherein the second terminal of first switching device of the first differential switching stage is connected to the second terminal of the first switching device of the second differential switching stage and the second terminal of the second switching device of the first differential switching stage is connected to the second terminal of the second switching device of the second differential switching stage.

9. The latch circuit of claim 8, comprising a biasing arrangement for controlling a voltage level of the plurality of clock signals required to control one or both of the first and second differential switching stages.

10. The latch circuit of claim 8, wherein the first switching stage comprises a pair of switching devices for each receiving one of a first pair of clock signals spaced apart by a predetermined duration and the second switching stage comprises a pair of switching devices for each receiving one of a second pair of clock signals having a phase angle generally opposing that of the first pair.

11. A method of operating a logic circuit, said method comprising:
receiving at least first and second clock signals spaced apart by a predetermined phase angle;
combining the first and second clock signals to produce a resultant signal having a phase angle based upon a combination of the phase angles of the first and second clock signals; and
switching first and second currents through first and second loads in response to a combination of the plurality of clock signals, wherein the steps of receiving, combing, and switching are performed by first and second differential switching stages arranged to receive the first and second clock signals and each comprising first and second switching devices in a parallel arrangement, the first and second switching devices of the first and second switching stages each having a control terminal, a first terminal, and a second terminal, wherein the second terminal of first switching device of the first differential switching stage is connected to the second terminal of the first switching device of the second differential switching stage and the second terminal of the second switching device of the first differential switching stage is connected to the second terminal of the second switching device of the second differential switching stage.

12. The method of claim 11, wherein the combination of the phase angles of the first and second clock signals is a result of phasor addition of the first and second clock signals.

13. The method of claim 11, wherein the switching of the first and second currents is performed differentially, such that the first current is relatively high whilst the second current is relatively low.

14. The method of claim 11, further comprising determining a bias voltage such that a predetermined voltage level of each of the plurality of clock signals is required to switch the first and second currents.

15. The method of claim 11, wherein the plurality of clock signals comprise I and Q quadrature clock signals.

16. The method of claim 11, further comprising equally loading the first and second clock signals, such that a resultant phase and amplitude of the first and second clock signals is substantially equal.

* * * * *